(12) United States Patent
Ohashi et al.

(10) Patent No.: US 9,957,126 B2
(45) Date of Patent: May 1, 2018

(54) COMPONENT SUPPLY DEVICE

(71) Applicant: FUJI MACHINE MFG. CO., LTD., Chiryu (JP)

(72) Inventors: Hiroyasu Ohashi, Toyota (JP); Hiroki Murase, Nagoya (JP)

(73) Assignee: FUJI MACHINE MFG. CO., LTD., Chiryu (JP)

(*) Notice: Subject to any disclaimer, the term of this patent is extended or adjusted under 35 U.S.C. 154(b) by 0 days. days.

(21) Appl. No.: 14/911,377

(22) PCT Filed: Aug. 26, 2013

(86) PCT No.: PCT/JP2013/072773
§ 371 (c)(1),
(2) Date: Feb. 10, 2016

(87) PCT Pub. No.: WO2015/029121
PCT Pub. Date: Mar. 5, 2015

(65) Prior Publication Data
US 2016/0192547 A1  Jun. 30, 2016

(51) Int. Cl.
| | | |
|---|---|---|
| *B65H 19/18* | (2006.01) | |
| *B65H 20/20* | (2006.01) | |
| *H05K 13/00* | (2006.01) | |
| *H05K 13/04* | (2006.01) | |
| *H05K 13/02* | (2006.01) | |

(52) U.S. Cl.
CPC ......... *B65H 19/1805* (2013.01); *B65H 20/20* (2013.01); *H05K 13/0084* (2013.01); *H05K 13/021* (2013.01); *H05K 13/0417* (2013.01)

(58) Field of Classification Search
CPC .... B65H 19/1805; B65H 20/20; B65H 20/22; H05K 13/02
See application file for complete search history.

(56) References Cited

U.S. PATENT DOCUMENTS

| | | | |
|---|---|---|---|
| 8,678,065 B2* | 3/2014 | Hwang | H05K 13/0417 156/764 |
| 9,580,264 B2* | 2/2017 | Yamasaki | H05K 13/0417 |
| 2003/0219330 A1 | 11/2003 | Lyndaker et al. | |
| 2008/0093375 A1 | 4/2008 | Davis et al. | |
| 2010/0239401 A1* | 9/2010 | Kim | B65H 37/002 414/412 |

(Continued)

FOREIGN PATENT DOCUMENTS

| | | |
|---|---|---|
| JP | 5-175686 A | 7/1993 |
| JP | 2005-539370 A | 12/2005 |

(Continued)

OTHER PUBLICATIONS

International Search Report dated Nov. 12, 2013 in PCT/JP13/072773 Filed Aug. 26, 2013.

(Continued)

*Primary Examiner* — Michael C McCullough
(74) *Attorney, Agent, or Firm* — Oblon, McClelland, Maier & Neustadt, L.L.P.

(57) ABSTRACT

A component supply device provided with a rail which transports a carrier tape, and a movable member which is provided above the rail and moves up and down, in which a gap above the carrier tape which passes a bottom portion of the movable member is blocked by the movable member.

5 Claims, 10 Drawing Sheets

(56) References Cited

U.S. PATENT DOCUMENTS

2011/0243695 A1* 10/2011 Hwang .............. H05K 13/0417
414/412

FOREIGN PATENT DOCUMENTS

| JP | 2011-211169 A | 10/2011 | | |
|----|----|----|----|----|
| WO | 03/101172 A1 | 12/2003 | | |
| WO | WO 2006/034995 A1 | 4/2006 | | |
| WO | WO-2014025115 A1 * | 2/2014 | ......... | H05K 13/0417 |

OTHER PUBLICATIONS

Extended European Search Report dated Mar. 7, 2017 in Patent Application No. 13892202.6.

* cited by examiner

COMPONENT SUPPLY DEVICE

TECHNICAL FIELD

The present application is related to a component supply device which continuously supplies carrier tape without splicing.

BACKGROUND ART

For example, PTL 1 discloses a component supply device which supplies components which are stored in carrier tape to a component mounting machine without performing splicing work. A rail along which the carrier tape is transported and a sprocket provided beneath the rail which engages with the carrier tape are arranged in the insertion portion of the carrier tape of the component supply device, and a first retaining member and a second retaining member are arranged above the rail in order from the downstream side in the transport direction of the carrier tape. When an operator inserts the leading end of the carrier tape into the insertion portion, the carrier tape engages with the sprocket which is provided beneath the rail and is transported to the supply section by the rotation of the sprocket.

Next, a carrier tape to be supplied in succession assumes a standby state above the moving carrier tape due to the worker inserting the leading end of the carrier tape to be supplied in succession to the moving carrier tape into an insertion portion from above the moving carrier tape and causing the leading end to abut the first retaining member. When the moving carrier tape passes under the second retaining member completely, the standby carrier tape is pushed onto the rail by the second retaining member, engages with the sprocket, and enters the space between the rail and the first retaining member due to the rotation of the sprocket. A level difference is formed on the bottom surface of the upstream side of the first retaining member so as to facilitate the entry of the standby carrier tape, and it is possible to transport the standby carrier tape to the supply section in continuation from the moving carrier tape.

In this manner, in the component supply device of PTL 1, since it is not necessary to perform splicing work to join the standby carrier tape to the rear end of the moving carrier tape, there is a merit in that the operational efficiency is good.

PATENT LITERATURE

Citation List

PTL 1: JP-A-2011-211169

SUMMARY

Problem to be Solved

In the component supply device of PTL 1, since a level difference is formed in the bottom surface of the upstream side of the first retaining member as described above, depending on the shape of the standby carrier tape, there is a case in which the standby carrier tape is transported by being dragged by the moving carrier tape, and the carrier tapes become blocked within the component supply device.

An object of the present disclosure is to provide a component supply device in which there is no occurrence of the standby carrier tape being transported by being dragged by the moving carrier tape and the carrier tapes becoming blocked within the component supply device.

Means for Solving the Problem

A component supply device of the present disclosure which continuously supplies a carrier tape in which components are stored without splicing is provided with a rail which transports the carrier tape, and a movable member which is provided above the rail and moves up and down, in which a gap above the carrier tape which passes a bottom portion of the movable member is blocked by the movable member.

Effects

According to the present disclosure, it is possible to provide a component supply device in which there is no occurrence of the standby carrier tape being transported by being dragged by the moving carrier tape and the carrier tapes becoming blocked within the component supply device.

DESCRIPTION OF EMBODIMENTS

Hereinafter, description will be given of an example of the present disclosure based on the drawings.

Figure 1:
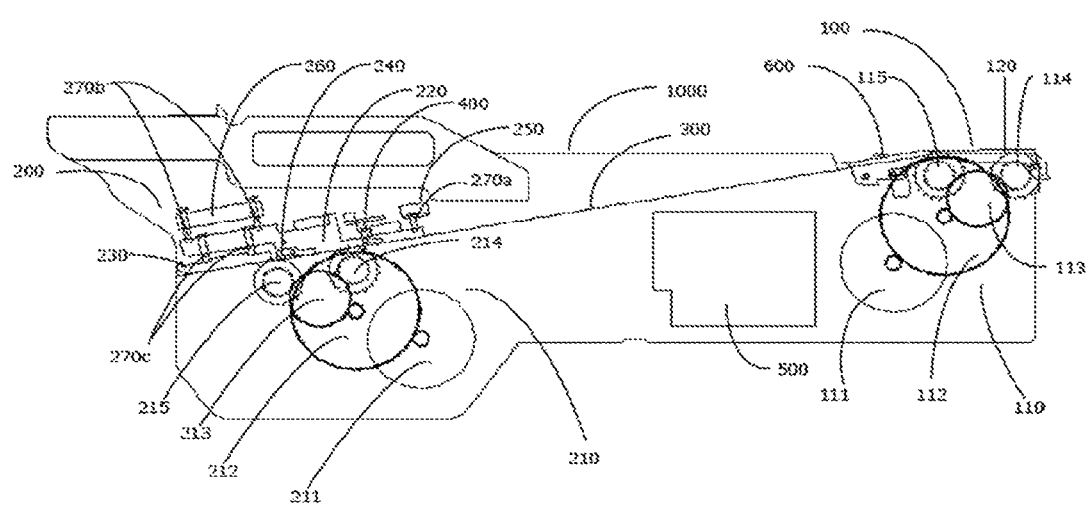
FIG. 1 is a cutaway side diagram of a component supply device.

FIG. 1 is a diagram illustrating a component supply device of an example of the present disclosure. Component supply device 1000 is formed of supply section 100, replenishing section 200, supply section drive system 110, replenishing section drive system 210, rail 300, detection section 400, and control section 500. Supply section 100 is a portion configured to capable of exposing a component which is stored in the carrier tape which is transported by replenishing section 200, and supplying the component to a component mounting machine. Replenishing section 200 is a portion configured to continuously supply the carrier tape which is supplied in a reel state. The drive system of supply section 100 is a portion configured to transmit the drive force of first motor 111 to supply section 100, and replenishing section drive system 210 is a portion configured to transmit the drive force of second motor 211 to replenishing section 200. Detection section 400 is a portion configured to be capable of monitoring the transport state of the carrier tape in replenishing section 200. Control section 500 is a portion configured to control the component supply device 1000.

Figure 2:
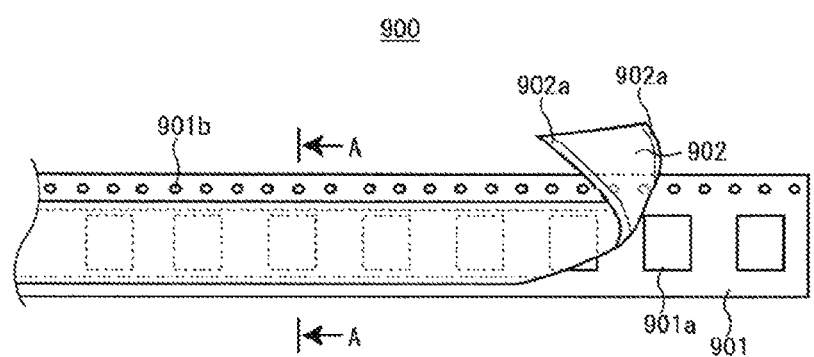
FIG. 2 is a top view of a carrier tape.
Figure 3:
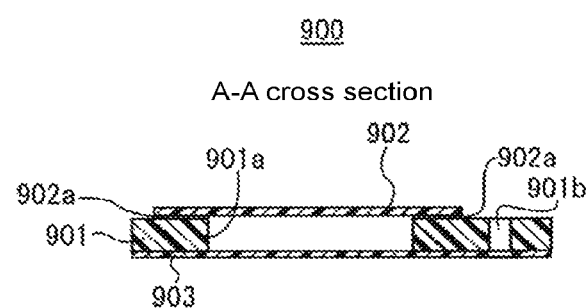
FIG. 3 is an A-A sectional diagram of the carrier tape illustrated in FIG. 2.

FIGS. 2 and 3 are diagrams illustrating the carrier tape. FIG. 2 is a diagram illustrating a state in which a portion of the cover tape is separated, and FIG. 3 is a diagram illustrating the A-A' section of FIG. 2. Carrier tape 900 is formed of base tape 901 and cover tape 902 bonded thereon. Base tape 901 is formed of a paper material or the like, feeding holes 901b are formed on the side portion at a fixed interval, and components (not depicted in the drawings) are stored in storage spaces 901a which are formed with a fixed depth. Cover tape 902 is formed of a transparent polymer film and is bonded to base tape 901 by adhesive portions 902a.

Carrier tape 900 is generally made into a product in a state wound on a reel, and is transported from replenishing section 200 toward supply section 100 by component supply device 1000. Carrier tape 900 is configured to allow cover tape 902 to separate from base tape 901 at the supply section 100 and the component (not depicted in the drawings) in the exposed storage space 901a to be supplied to the component mounting machine.

Supply section 100 is positioned on the front portion of component supply device 1000, and includes supply section drive system 110, rail 300, and peeling device 600 which peels cover tape 902 from base tape 901. Supply section drive system 110 is formed of first motor 111, first intermediate gear 112, second intermediate gear 113, first sprocket 114, and second sprocket 115, and feeding holes 901b of carrier tape 900 engage with each of the sprockets and cause carrier tape 900 to be transported. Carrier tape 900 is transported to peeling device 600 by second sprocket 115. Carrier tape 900 continues to be transported by second sprocket 115 in a state in which peeling device 600 exposes the components which are stored in carrier tape 900, and storage sections 901a of carrier tape 900 are positioned at supply position 120 by first sprocket 114. Since the peeling device 600 is well-known technology disclosed in Japanese Patent No. 2662948, JP-A-2009-140994, JP-UM-B-H7-23994, and the like, description thereof will be omitted.

Supply section 200 is positioned on the rear portion of component supply device 1000, and includes replenishing section drive system. 210, rail 300, first retaining member 220, second retaining member 230, movable member 240, first support member 250, second support member 260, and elastic members 270a, 270b, and 270c. Replenishing section drive system 210 is formed of second motor 211, third intermediate gear 212, fourth intermediate gear 213, third sprocket 214, and fourth sprocket 215, and feeding holes 901b of carrier tape 900 engage with third sprocket 214 and fourth sprocket 215 and cause carrier tape 900 to be transported to supply section 100.

Rail 300 supports the bottom face of carrier tape 900, and corresponding sprocket entrance holes (not depicted in the drawings) are formed so that third sprocket 214 and fourth sprocket 215 of the replenishing section drive system 210 can enter therein. The top surface of rail 300 is formed at an angle which is parallel to the bottom surface of first retaining member 220 and the bottom surface of second retaining member 230.

First retaining member 220 is provided on the top portion of rail 300, and the transportation of first carrier tape 900a is stabilized by applying a force of a fixed magnitude to the top surface of the moving first carrier tape 900a using elastic member 270c.

First retaining member 220 is crank shaped and the upstream side in the transport direction of carrier tape 900 is bent upward. The crank portion which is bent upward supports second retaining member 230 in a state of being capable of being lifted and lowered by a fixed amount in the up and down directions.

In addition to stabilizing the transportation of moving first carrier tape 900a using elastic member 270c, second retaining member 230 maintains standby second carrier tape 900b in the standby state.

The upstream side of bottom end portion 241 of the first retaining member 220 in the transport direction of carrier tape 900 is hollowed in the longitudinal direction, and end edge portion 242 forms a U-shaped cutout groove facing downward.

Figure 4:
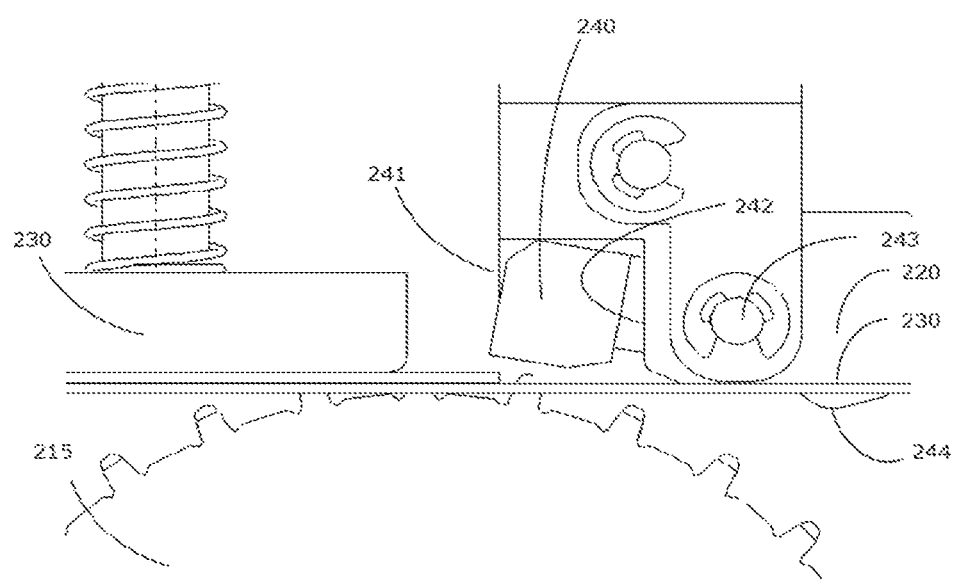
FIG. 4 is an enlarged diagram of a replenishing section.

As illustrated in FIGS. 1 and 4, movable member 240 is the shape of a block which is long in the transport direction of carrier tape 900, and is supported by the cutout groove formed in bottom end portion 241 of the first retaining member 220 so as to move up and down in an arc shape, rotating around support shaft 243 which is perpendicular to the transport direction of carrier tape 900. With movable member 240, the downstream side in the transport direction of the carrier tape 900 is always biased lower than support shaft 243 by an elastic member (not depicted in the drawings). A recess 310 is formed in the portion of rail 300 which comes into contact with the bottom end portion of the downstream side of movable member 240 in the transport direction of carrier tape 900, such that movable member 240 can rotate even when first retaining member 220 is contacting rail 300. Accordingly, in the stage before first carrier tape 900a is transported, the upstream side of movable member 240 in the transport direction of first carrier tape 900a assumes a flipped-up state, so as to facilitate the entrance of first carrier tape 900a between first retaining member 220 and rail 300.

During the transporting of first carrier tape 900a, movable member 240 enters a rotated state in which bottom end portion 244 of the downstream side in the transport direction of the carrier tape is pushed up by first carrier tape 900a. Movable member 240 in the rotated state blocks the gap above first carrier tape 900a and allows the transportation of first carrier tape 900a; however, the entrance of the standby second carrier tape between first retaining member 220 and first carrier tape 900a is blocked.

First support member 250 and second support member 260 support first retaining member 220 in a state of being capable of being lifted and lowered by a fixed distance in the up and down directions, support one end of elastic members 270a and 270b, and apply pressure in the direction of rail 302 to first retaining member 220 by elastic force.

Figure 5:
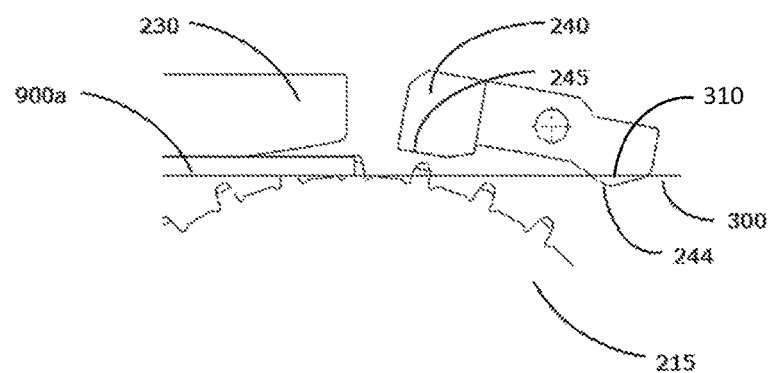
FIG. 5 is a diagram illustrating the process of the carrier tape being continuously supplied by the replenishing section without being spliced.
Figure 6:
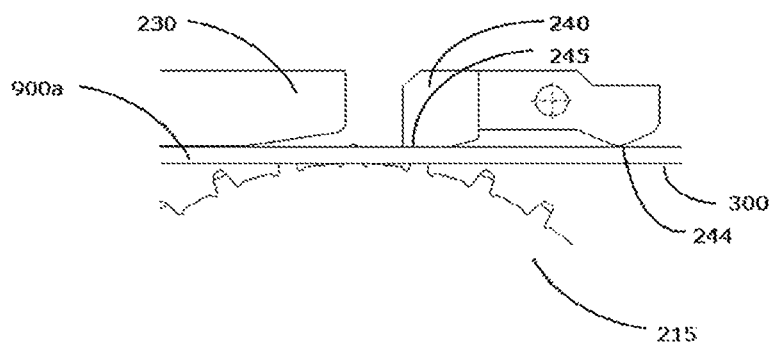
FIG. 6 is a diagram illustrating the process of the carrier tape being continuously supplied by the replenishing section without being spliced.
Figure 7:
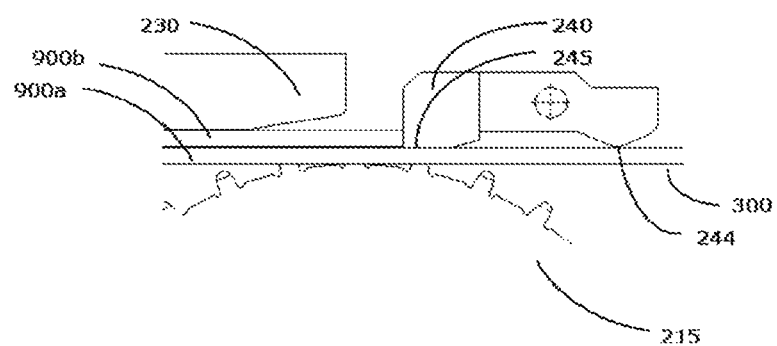
FIG. 7 is a diagram illustrating the process of the carrier tape being continuously supplied by the replenishing section without being spliced.
Figure 8:
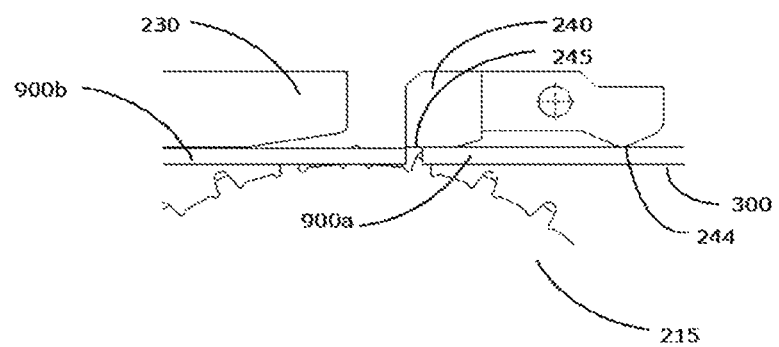
FIG. 8 is a diagram illustrating the process of the carrier tape being continuously supplied by the replenishing section without being spliced.
Figure 9:
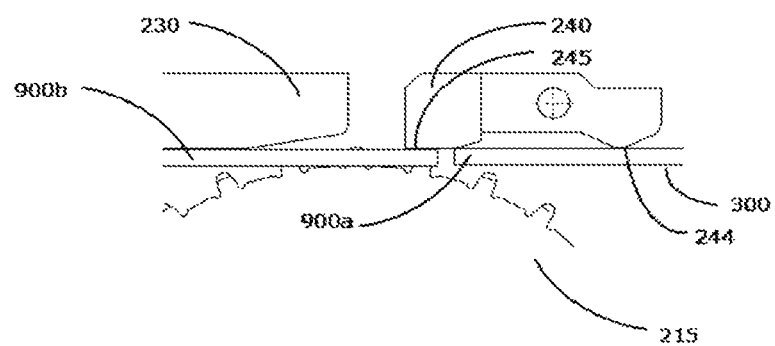
FIG. 9 is a diagram illustrating the process of the carrier tape being continuously supplied by the replenishing section without being spliced.

FIGS. 5 to 9 are diagrams illustrating the process of supplying carrier tape 900 continuously without splicing using replenishing section 200 according to an example of the present disclosure. First carrier tape 900a is inserted between second retaining member 230 and rail 300 by the operator. The transporting of first carrier tape 900a is started by a transport command which is transmitted from control section 500 to replenishing section drive system 210 (FIG. 5). In accordance with the transporting of first carrier tape 900a, bottom end portion 244 of the movable member on the downstream side in the transport direction of the carrier tape is pushed up, and bottom surface 245 of the movable member rotates to a position which blocks the gap above first carrier tape 900a (FIG. 6). Next, second carrier tape 900b is inserted between second retaining member 230 and first carrier tape 900a by the operator. Second carrier tape 900b is blocked from entering between first retaining member 220 and first carrier tape 900a by movable member 240 and enters the standby state (FIG. 7). When first carrier tape 900a completely leaves the region of second retaining member 230, second carrier tape 900b makes contact with rail 300 due to second retaining member 230 (FIG. 8). The transporting of second carrier tape 900b is started by fourth sprocket 215, and the transporting is started in continuation from first carrier tape 900a (FIG. 9). Although not illustrated in the drawings, if another carrier tape 900 is replenished during the transporting of second carrier tape 900b, it is possible to continuously supply the carrier tape 900 to component supply device 1000 without splicing.

Detection section 400 is formed of a sensor and a dog and is provided on the downstream side of third sprocket 214 in the transport direction of the carrier tape. Detection section 400 detects the boundary portion between first carrier tape 900a and second carrier tape 900b, and outputs the detection signal to control section 500.

Control section 500 is provided with a CPU, a memory, a drive section, and a communication section. The CPU is a calculation processing device and controls the operations of each part of component supply device 1000 based on the programs and data stored in the memory. The memory stores tape feed data in addition to the operational programs of the component supply device 1000. The tape feed data is data indicating the operational conditions such as the feed amount and the feed speed for transporting the supply target carrier tape 900. The drive section is controlled by the CPU and drives a motor. The communication section performs transmission and reception of signals with detection section 400.

Figure 10:
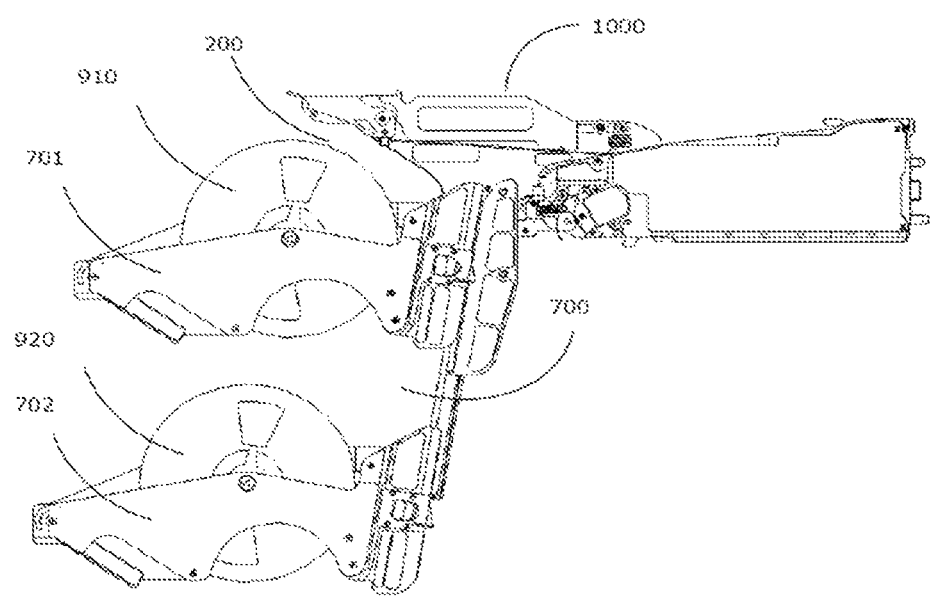
FIG. 10 is a diagram in which a component supply device is provided with a reel holder.

FIG. 10 is a diagram illustrating reel holders 700 which are provided in component supply device 1000 of an example of the present disclosure. For reel holders 700, first reel holder 701 and second reel holder 702 are each provided on the bottom portion of replenishing section 200. Reel holder 700 is a device which holds the reel-form carrier tape 900 in order to supply carrier tape 900 to replenishing section 200 in a stable manner. First carrier tape reel 910 and second carrier tape reel 920 are stored in first reel holder 701 and the second reel holder 702, respectively, and carrier tape 900 is supplied to replenishing section 200 by each of the carrier tape reels. Since second reel holder 702 is provided shifted from first reel holder 701 to the front or the rear along the transport direction of the carrier tape, carrier tapes 900 which are supplied by first carrier tape reel 910 and second carrier tape reel 920 do not interfere with each other.

Note that, in the example described above, movable member 240 is supported by the cutout groove formed in bottom end portion 241 of the first retaining member 220 so as to move up and down in an arc shape, rotating around support shaft 243 which is perpendicular to the transport direction of the carrier tape; however, a plate-shaped member which moves up and down in a linear manner in a cylinder may be provided on the upstream side of first retaining member 220 in the transport direction of the carrier tape. For example, the same effects can be obtained by providing the same mechanism as detection section 400 of the example described above in between first retaining member 220 and second retaining member 230, operating the cylinder using a signal which detected the end portion of first carrier tape 900a, and blocking the gap above the moving first carrier tape 900a using the plate-shaped member.

REFERENCE SIGNS LIST

1000 . . . component supply device, 100 . . . supply section, 200 . . . replenishing section, 110 . . . supply section drive system, 210 . . . replenishing section drive system, 300 . . . rail, 220 . . . first retaining member, 230 . . . second retaining member, 240 . . . movable member, 900 . . . carrier tape, 910 . . . first carrier tape, 920 . . . second carrier tape

The invention claimed is:

1. A component supply device which continuously supplies a carrier tape in which components are stored without splicing, the device comprising:
   a rail which supports a bottom face of the carrier tape; and
   a movable member above the rail that rotates around an axis so that a first end and a second end of the movable member move up and down opposite to each other, wherein
   a gap above the carrier tape which passes a bottom portion of the movable member is blocked by the first end of the movable member, and
   the rail includes a recess into which the second end of the movable member enters so the second end of the movable member extends beyond a top surface of the rail.

2. The component supply device according to claim 1, wherein
   the carrier tape is a first carrier tape, and
   the first carrier tape contacts the second end of the movable member to rotate the movable member so the gap is blocked by the first end of the movable member.

3. The component supply device according to claim 2, further comprising:
   a detection section that detects a boundary portion between the first carrier tape and a second carrier tape.

4. The component supply device according to claim 1, wherein
   when the movable member is rotated so that the gap is blocked by the first end of the movable member a second carrier tape inserted on top of the first carrier tape is blocked by the first end of the movable member.

5. The component supply device according to claim 1, wherein
   the movable member rotates around a support shaft that extends through the movable member and the axis is an axial center of the support shaft.

* * * * *